(12) United States Patent
Lim et al.

(10) Patent No.: US 12,216,167 B2
(45) Date of Patent: Feb. 4, 2025

(54) METHOD AND APPARATUS FOR GENERATING CHARGING PATH FOR BATTERY

(71) Applicant: Samsung Electronics Co., Ltd., Suwon-si (KR)

(72) Inventors: Ju Wan Lim, Suwon-si (KR); Daeryong Jung, Seoul (KR); Jinho Kim, Yongin-si (KR); Young Hun Sung, Hwaseong-si (KR); Duk Jin Oh, Seoul (KR); Myeongjae Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 545 days.

(21) Appl. No.: 17/510,670

(22) Filed: Oct. 26, 2021

(65) Prior Publication Data

US 2022/0381830 A1 Dec. 1, 2022

(30) Foreign Application Priority Data

May 31, 2021 (KR) .................. 10-2021-0069936

(51) Int. Cl.
  *G01R 31/367* (2019.01)
  *G01R 31/3828* (2019.01)
  *H02J 7/00* (2006.01)
(52) U.S. Cl.
  CPC ....... *G01R 31/367* (2019.01); *G01R 31/3828* (2019.01); *H02J 7/00036* (2020.01); *H02J 7/0071* (2020.01)

(58) Field of Classification Search
  None
  See application file for complete search history.

(56) References Cited

U.S. PATENT DOCUMENTS

| 10,566,819 | B2 | 2/2020 | Barsukov et al. |
| 2019/0072618 | A1* | 3/2019 | Ghantous ............... H02J 7/005 |

(Continued)

FOREIGN PATENT DOCUMENTS

| CN | 106450537 B | 12/2018 |
| JP | 2020-134279 A | 8/2020 |

(Continued)

OTHER PUBLICATIONS

Extended European Search report issued on May 27, 2022, in counterpart European Patent Application No. 21217975.8 (10 pages in English).

*Primary Examiner* — Brent A. Fairbanks
(74) *Attorney, Agent, or Firm* — NSIP Law

(57) ABSTRACT

To generate a charging path for a battery, a method includes generating simulation data for charging currents based on a battery model indicating an internal state of a battery, generating an initial look-up table (LUT) for the charging currents and preset battery voltage limits based on the simulation data, the initial LUT representing initial charging limit conditions of the battery for stages corresponding to the charging currents, generating a modified LUT by adjusting at least one of the initial charging limit conditions of the initial LUT, in response to the initial LUT failing to satisfy a threshold, determining a final LUT based on the modified LUT, in response to the modified LUT satisfying the threshold, and generating a charging path for the battery based on the final LUT.

17 Claims, 15 Drawing Sheets

(56) References Cited

U.S. PATENT DOCUMENTS

| | | | |
|---|---|---|---|
| 2019/0120910 A1* | 4/2019 | Ghantous | G01R 31/392 |
| 2019/0369166 A1* | 12/2019 | Moslemi | H02J 3/144 |
| 2020/0103469 A1* | 4/2020 | Jung | G01R 31/382 |
| 2020/0136173 A1 | 4/2020 | Hong et al. | |
| 2020/0150185 A1 | 5/2020 | Ramezan Pour Safaei et al. | |
| 2020/0212684 A1 | 7/2020 | Campbell et al. | |
| 2020/0335993 A1 | 10/2020 | Jung et al. | |
| 2021/0296908 A1* | 9/2021 | Berkowitz | H02J 7/0071 |

FOREIGN PATENT DOCUMENTS

| | | | |
|---|---|---|---|
| KR | 10-2019-0045736 A | 5/2019 | |
| KR | 10-2020-0037592 A | 4/2020 | |
| KR | 10-2020-0069203 A | 6/2020 | |
| KR | 10-2141268 B1 | 8/2020 | |
| TW | 1465939 B * | 1/2013 | G06F 17/10 |

\* cited by examiner

| Stage | Charging current(A) | Battery voltage limit(V) | Initial LUT(V) |
|---|---|---|---|
| 1 | 7.92 | 4.130 | 0.061 |
| 2 | 7.57 | 4.130 | 0.061 |
| 3 | 7.12 | 4.130 | 0.053 |
| 4 | 6.67 | 4.300 | 0.038 |
| 5 | 6.23 | 4.300 | 0.040 |
| 6 | 5.79 | 4.300 | 0.041 |
| 7 | 5.34 | 4.300 | 0.043 |
| 8 | 4.89 | 4.300 | 0.046 |
| 9 | 4.45 | 4.380 | 0.005 |
| Charging time (min) | | | 27.13 |
| Aging rate (mAh/cycle) | | | 0.1803 |

FIG. 8

| Stage | Charging current(A) | Battery voltage limit(V) | LUT1(V) | LUT2(V) | LUT3(V) | ... | LUT63(V) | LUT64(V) |
|---|---|---|---|---|---|---|---|---|
| 1 | 7.92 | 4.130 | 0.061 | 0.062 | 0.062 | ... | 0.062 | 0.062 |
| 2 | 7.57 | 4.130 | 0.061 | 0.061 | 0.061 | ... | 0.062 | 0.062 |
| 3 | 7.12 | 4.130 | 0.053 | 0.053 | 0.054 | ... | 0.052 | 0.052 |
| 4 | 6.67 | 4.300 | 0.038 | 0.038 | 0.038 | ... | 0.052 | 0.053 |
| 5 | 6.23 | 4.300 | 0.040 | 0.040 | 0.040 | ... | 0.054 | 0.054 |
| 6 | 5.79 | 4.300 | 0.041 | 0.041 | 0.041 | ... | 0.053 | 0.053 |
| 7 | 5.34 | 4.300 | 0.043 | 0.043 | 0.043 | ... | 0.052 | 0.052 |
| 8 | 4.89 | 4.300 | 0.046 | 0.046 | 0.046 | ... | 0.048 | 0.048 |
| 9 | 4.45 | 4.380 | 0.005 | 0.005 | 0.005 | ... | 0.005 | 0.005 |
| Charging time (min) | | | 27.13 | 27.13 | 27.13 | ... | 29.98 | 30.08 |
| Aging rate (mAh/cycle) | | | 0.1803 | 0.1802 | 0.1801 | ... | 0.1422 | 0.1413 |

FIG. 14

METHOD AND APPARATUS FOR GENERATING CHARGING PATH FOR BATTERY

CROSS-REFERENCE TO RELATED APPLICATIONS

This application claims the benefit under 35 USC § 119(a) of Korean Patent Application No. 10-2021-0069936, filed on May 31, 2021, in the Korean Intellectual Property Office, the entire disclosure of which is incorporated herein by reference for all purposes.

BACKGROUND

1. Field

The following description relates to technology that charges a battery, and more particularly, to technology that generates a charging path for a battery.

2. Description of Related Art

Batteries are charged using various methods. For example, a constant current-constant voltage charging method charges a battery with constant currents, and charges the battery at a constant voltage when a voltage of the battery reaches a preset level. A varying current decay charging method charges a battery with high currents at a low state of charge (SOC), and gradually reduces the currents when the battery has a predetermined SOC by charging. In addition to the aforementioned methods, a multi-step charging method charges a battery with constant currents, and a pulse charging method charges a battery by repeatedly applying pulse currents at short time intervals.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of generating a charging path for a battery, the method including generating simulation data for charging currents based on a battery model indicating an internal state of a battery, generating an initial look-up table (LUT) for the charging currents and preset battery voltage limits based on the simulation data, the initial LUT representing initial charging limit conditions of the battery for stages corresponding to the charging currents, generating a modified LUT by adjusting at least one of the initial charging limit conditions of the initial LUT, in response to the initial LUT failing to satisfy a threshold, determining a final LUT based on the modified LUT, in response to the modified LUT satisfying the threshold, and generating a charging path for the battery based on the final LUT.

The charging path may correspond to a partial stage of a total charging capacity of the battery.

The method may include obtaining one or more parameters indicating a state of the battery, and updating the battery model based on the one or more parameters, wherein the generating of the simulation data comprises generating the simulation data for the charging currents based on the updated battery model.

The generating of the initial LUT may include determining, as a first initial charging limit condition for a first stage, an anode potential at a time a first charging current of the charging currents reaches a first battery voltage limit of the preset battery voltage limits, determining, as a second initial charging limit condition for a second stage, an anode potential at a time a second charging current of the charging currents reaches a second battery voltage limit of the preset battery voltage limits, and generating the initial LUT based on the first initial charging limit condition and the second initial charging limit condition.

The method may include determining whether the initial LUT satisfies the threshold based on generating a first charging result for the first stage and a second charging result for the second stage, generating a charging result for the initial LUT based on the first charging result and the second charging result, and determining whether the charging result satisfies the threshold.

The generating of the modified LUT may include generating candidate LUTs by adjusting each of the initial charging limit conditions of the initial LUT within a range, calculating efficiencies for the candidate LUTs, determining a target stage having a highest efficiency from among stages of the initial LUT, and generating the modified LUT by adjusting an initial charging limit condition of the target stage.

The calculating of the efficiencies for the candidate LUTs may include calculating a first charging time and a first aging rate of a first candidate LUT, and calculating a first efficiency for the first candidate LUT based on the first charging time and the first aging rate.

The calculating of the first charging time and the first aging rate of the first candidate LUT may include calculating a first sub-charging time and a first sub-aging rate for a first stage of the first candidate LUT, calculating a second sub-charging time and a second sub-aging rate for a second stage of the first candidate LUT, and calculating the first charging time based on the first sub-charging time and the second sub-charging time and calculating the first aging rate based on the first sub-aging rate and the second sub-aging rate.

The determining of the final LUT may include determining the modified LUT or a LUT previous to the modified LUT as the final LUT according to a preset policy.

The determining of the final LUT may include calculating a first difference between a charging time of the modified LUT and a target charging time being as the threshold, calculating a second difference between a charging time of the LUT previous to the modified LUT and the target charging time, and determining a LUT corresponding to a smaller one of the first difference and the second difference as the final LUT.

The battery may be included in a mobile terminal.

The battery may be included in a vehicle.

In another general aspect, there is provided an electronic device for generating a charge path for a battery, the electronic device including a processor configured to generate simulation data for charging currents based on a battery model indicating an internal state of a battery, generate an initial look-up table (LUT) for the charging currents and preset battery voltage limits based on the simulation data, the initial LUT representing initial charging limit conditions of the battery for stages corresponding to the charging currents, generate a modified LUT by adjusting at least one of the initial charging limit conditions of the initial LUT, in response to the initial LUT failing to satisfy a threshold, determine a final LUT based on the modified LUT when the modified LUT satisfies the threshold, and generate a charging path for the battery based on the final LUT.

The electronic device and the battery may be included in a mobile communication terminal.

The electronic device and the battery may be included in a vehicle.

In another general aspect, there is provided method of determining charging limit conditions for charging a battery, the method including generating simulation data for charging currents based on a battery model indicating an internal state of a battery, generating look-up tables (LUTs) for the charging currents and preset battery voltage limits based on the simulation data, the LUTs each representing charging limit conditions of the battery for stages corresponding to the charging currents, determining a target LUT from among the LUTs based on a threshold, and determining target charge limit conditions of the target LUT as the charge limit conditions of the battery.

The generating of the LUTs may include generating an initial LUT for the charging currents and the preset battery voltage limits based on the simulation data, the initial LUT representing initial charging limit conditions of the battery for the stages corresponding to the charging currents, and generating modified LUTs based on the initial LUT, the initial LUT and each of the modified LUTs having at least one different charging limit condition.

The generating of the modified LUTs based on the initial LUT may include generating candidate LUTs by adjusting each of the initial charging limit conditions of the initial LUT within a range, calculating efficiencies for the candidate LUTs, determining a target stage having a highest efficiency from among stages of the initial LUT, and generating a first modified LUT by adjusting an initial charging limit condition of the target stage.

The generating of the modified LUTs based on the initial LUT may include generating a second modified LUT by adjusting a value of a target initial charging limit condition of charging limit conditions included in the first modified LUT.

Other features and aspects will be apparent from the following detailed description, the drawings, and the claims.

BRIEF DESCRIPTION OF THE DRAWINGS

FIG. 8 illustrates an example of an initial LUT.

FIG. 14 illustrates examples of an initial LUT and multiple LUTs.

Figure 1:
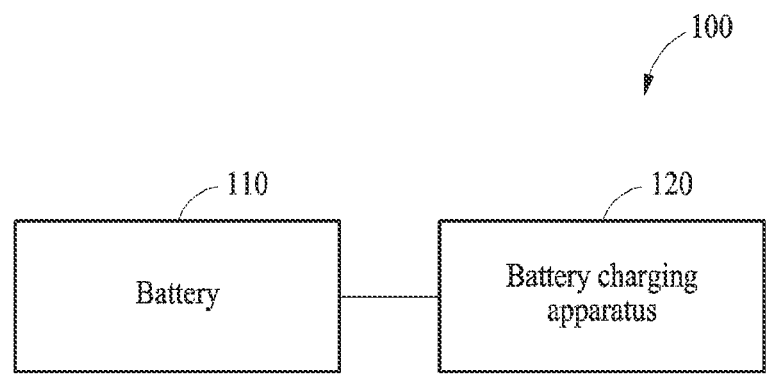
FIG. 1 illustrates an example of a configuration of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

The use of the term "may" herein with respect to an example or embodiment (e.g., as to what an example or embodiment may include or implement) means that at least one example or embodiment exists where such a feature is included or implemented, while all examples are not limited thereto.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the examples described above and an element having a common function. Unless otherwise mentioned, the descriptions on the examples may be applicable to the following examples and thus, duplicated descriptions will be omitted for conciseness.

FIG. 1 illustrates an example of a configuration of a battery system.

Referring to FIG. 1, a battery 110 may be one or more battery cells, battery modules, or battery packs. The battery 110 may include a capacitor, a secondary battery, or a lithium-ion battery for storing power as a result of charging. A device employing the battery 110 may receive power from the battery 110.

A battery charging apparatus 120 charges the battery 110 using a battery model. For example, the battery charging apparatus 120 may fast charge the battery 110 in a multi-step charging manner that minimizes charging aging using an estimate of the internal state of the battery based on the battery model. Here, the battery model may be an electrochemical model to which aging parameters of the battery 110 are applied to estimate state information of the battery 110 by modeling internal physical phenomena such as potential and ion concentration distribution of the battery 110. In addition, the internal state of the battery 110 may include any one or any combination of a cathode lithium ion concentration distribution, an anode lithium ion concentration distribution, an electrolyte lithium ion concentration distribution, a cathode potential, and an anode potential of the battery 110. For example, the aging parameters may include any one or any combination of an electrode balance shift, a capacity for cathode active material, and an anode surface resistance of the battery 110. However, examples are not limited thereto.

The battery charging apparatus 120 may divide the charging process into several charging stages (or steps) and charge the battery 110 with a charging current corresponding to each charging stage. For each of the charging stages, a charging limit condition for limiting charging of the battery 110 to charge the battery 110 by a target charging capacity during a target charging time while preventing aging of the battery 110 may be set.

For example, the charging limit condition may include internal state conditions of the battery 110 for the respective charging stages. The internal state conditions may be defined by the electrochemical model based on at least one internal state that affects the aging of the battery 110. The internal state conditions may include any one or any combination of an anode overpotential condition, a cathode overpotential condition, an anode surface lithium ion concentration condition, a cathode surface lithium ion concentration condition, a cell voltage condition, and a state of charge (SOC) condition for the battery 110.

Since the battery 110 may be aged when one of the internal state conditions is reached as the battery 110 is charged, the battery charging apparatus 120 may control the charging of the battery 110 using the internal state conditions. For example, if it is determined that the battery 110 is aged when the anode overpotential of the battery 110 falls below 0.005 volts (V), the anode overpotential condition may be set based on 0.005 V. Aging conditions are conditions that cause aging when an internal state of the battery 110 is reached. Here, the anode overpotential of 0.005 V may be an aging condition that causes aging when the anode overpotential of the battery 110 is reached. However, the internal state conditions are not limited to the examples above, and various expressions quantifying the internal states that affect the aging of the battery 110 may be employed.

Overpotential is a voltage drop caused by departing from the equilibrium potential associated with an intercalation/deintercalation reaction at each electrode of the battery 110. The lithium ion concentration described above is a concentration of lithium ions when the material in an active material of each electrode of the battery is lithium ions. Materials other than lithium ions may be employed as the material in the active material.

An SOC is a parameter indicating a charging state of the battery 110. The SOC indicates an amount of energy stored in the battery 110, and the amount may be expressed in percent (%), for example, indicated as 0% to 100%. For example, 0% may indicate a fully discharged state, and 100% may indicate a fully charged state. Such a metric may be variously modified in varied examples, for example, defined depending on a design intention or an aspect of such examples. The SOC may be estimated or measured using various schemes.

The battery 110 may include two electrodes (cathode and anode) for intercalation/deintercalation of lithium ions, an electrolyte that is a medium through which lithium ions may move, a separator that physically separates the cathode and the anode to prevent direct flow of electrons but to allow ions to pass therethrough, and a collector that collects electrons generated by an electrochemical reaction or supplies electrons required for an electrochemical reaction. The cathode may include a cathode active material, and the anode may include an anode active material. For example, lithium cobalt oxide ($LiCoO_2$) may be used as the cathode active material, and graphite ($C_6$) may be used as the anode active material. Lithium ions move from the cathode to the anode while the battery 110 is charged, and lithium ions move from the anode to the cathode while the battery 110 is discharged. Thus, the concentration of lithium ions in the cathode active material and the concentration of lithium ions in the anode active material change in response to charging and discharging.

The electrochemical model may be employed in various manners to express the internal state of the battery 110. For example, a single particle model (SPM) and various application models may be employed for the electrochemical model, and parameters defining the electrochemical model may be variously modified depending on a design intention. The internal state conditions may be derived from the electrochemical model of the battery 110, or may be derived experimentally or empirically. In an example, the technique of defining the internal state conditions is not limited.

The charging limit condition may include maximum charging times for the respective charging stages. A maximum charging time may be a condition for a maximum time required to charge the battery 110 with a charging current of a corresponding charging stage.

The charging limit condition may include anode potential limits for the respective charging stages. The anode potential of the battery 110 may decrease as the battery 110 is charged, and the anode potential limit may refer to the minimum anode potential allowed in the corresponding charging stage.

As described above, the internal state conditions and/or the charging limit conditions for the respective charging stages are charging conditions set to achieve two objectives of preventing aging of the battery 110 and charging the battery by a target charging capacity during a target charging time, and may be controlled based on the charging efficiency of the battery 110 as it will be described later.

According to the charging control by the battery charging apparatus 120, a charging stage of the battery 110 may be switched from a first charging stage to a second charging stage at a point in time when the internal state of the battery 110 reaches one of the internal state conditions or the charging time of the battery 110 reaches a maximum charging time while the battery 110 is charged with a first charging current in the first charging stage. This process may be iteratively performed until the last charging stage.

Repeated use of the battery 110 ages the battery 110, and the aging rate of the battery 110 may vary depending on the usage history of the battery 110. If the battery 110 is charged without consideration of the aging rate, it may be impossible to avoid the aging conditions during fast charging, which may lead to rapid aging and result in a reduction in the battery life. Accordingly, the battery charging apparatus 120 needs to adaptively perform charging control for the battery 110 based on the aging rate, which will be described in detail below with reference to the drawings.

Figure 2:
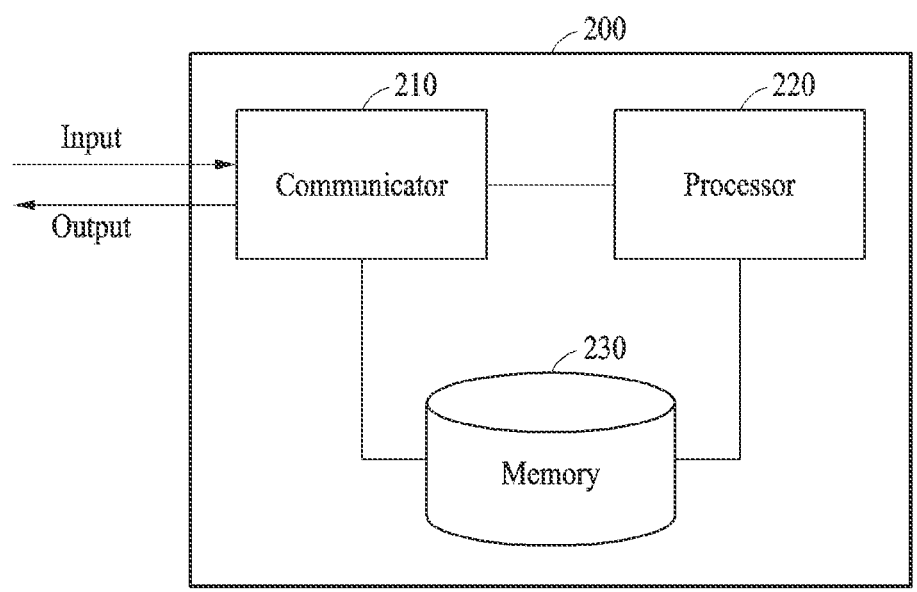
FIG. 2 illustrates an example of a configuration of an electronic device.

FIG. 2 illustrates an example of a configuration of an electronic device.

Referring to FIG. 2, an electronic device 200 for controlling a battery includes a communicator 210, a processor 220, and a memory 230. For example, the electronic device 200 may correspond to the battery charging apparatus 120 described above with reference to FIG. 1.

In an example, the electronic device 200 may be included in a mobile communication terminal.

In another example, the electronic device 200 may be included in a vehicle.

The communicator 210 is connected to the processor 220 and the memory 230 and transmits and receives data to and from the processor 220 and the memory 230. The communicator 210 may be connected to another external device and transmit and receive data to and from the external device. Hereinafter, transmitting and receiving "A" may refer to transmitting and receiving "information or data indicating A".

The communicator 210 may be implemented as a circuitry in the electronic device 200. For example, the communicator 210 may include an internal bus and an external bus. In another example, the communicator 210 may be an element that connects the electronic device 200 to the external device. The communicator 210 may be an interface. The communicator 210 may receive data from the external device and transmit the data to the processor 220 and the memory 230.

The processor 220 processes the data received by the communicator 210 and data stored in the memory 230. The "processor" may be a data processing device implemented by hardware including a circuit having a physical structure to perform desired operations. For example, the desired operations may include code or instructions included in a program. For example, the hardware-implemented data processing device may include a microprocessor, a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a microcomputer, a processor core, a multi-core processor, a multiprocessor, a central processing unit (CPU), an application-specific integrated circuit (ASIC), a field-programmable gate array (FPGA), a graphics processing unit (GPU), a neural processing unit (NPU), a tensor processing unit (TPU), a digital signal processor (DSP), a controller and an arithmetic logic unit (ALU), an application processor (AP), a neural processing unit (NPU), or a programmable logic unit (PLU).

The processor 220 executes a computer-readable code (for example, software) stored in a memory (for example, the memory 230) and instructions triggered by the processor 220.

The memory 230 stores the data received by the communicator 210 and data processed by the processor 220. For example, the memory 230 may store the program (or an application, or software). For example, the stored program may be a set of syntaxes that are coded and executable by the processor 220 to generate a charging path for a battery. As another example, the stored program may be a set of syntaxes that are coded and executable by the processor 220 to determine a charging limit condition of a battery.

The memory 230 may include, for example, at least one of volatile memory, nonvolatile memory, random-access memory (RAM), flash memory, a hard disk drive, dynamic random-access memory (DRAM), a static random access memory (SRAM), a thyristor RAM (T-RAM), a zero capacitor RAM (Z-RAM), a twin transistor RAM (TTRAM), and an optical disk drive. Further description of the memory is provided below.

The memory 230 may store an instruction set (for example, software) for operating the electronic device 200. The instruction set for operating the electronic device 200 is executed by the processor 220.

The communicator 210, the processor 220, and the memory 230 will be described further below with reference to FIGS. 3 and 20.

Figure 3:
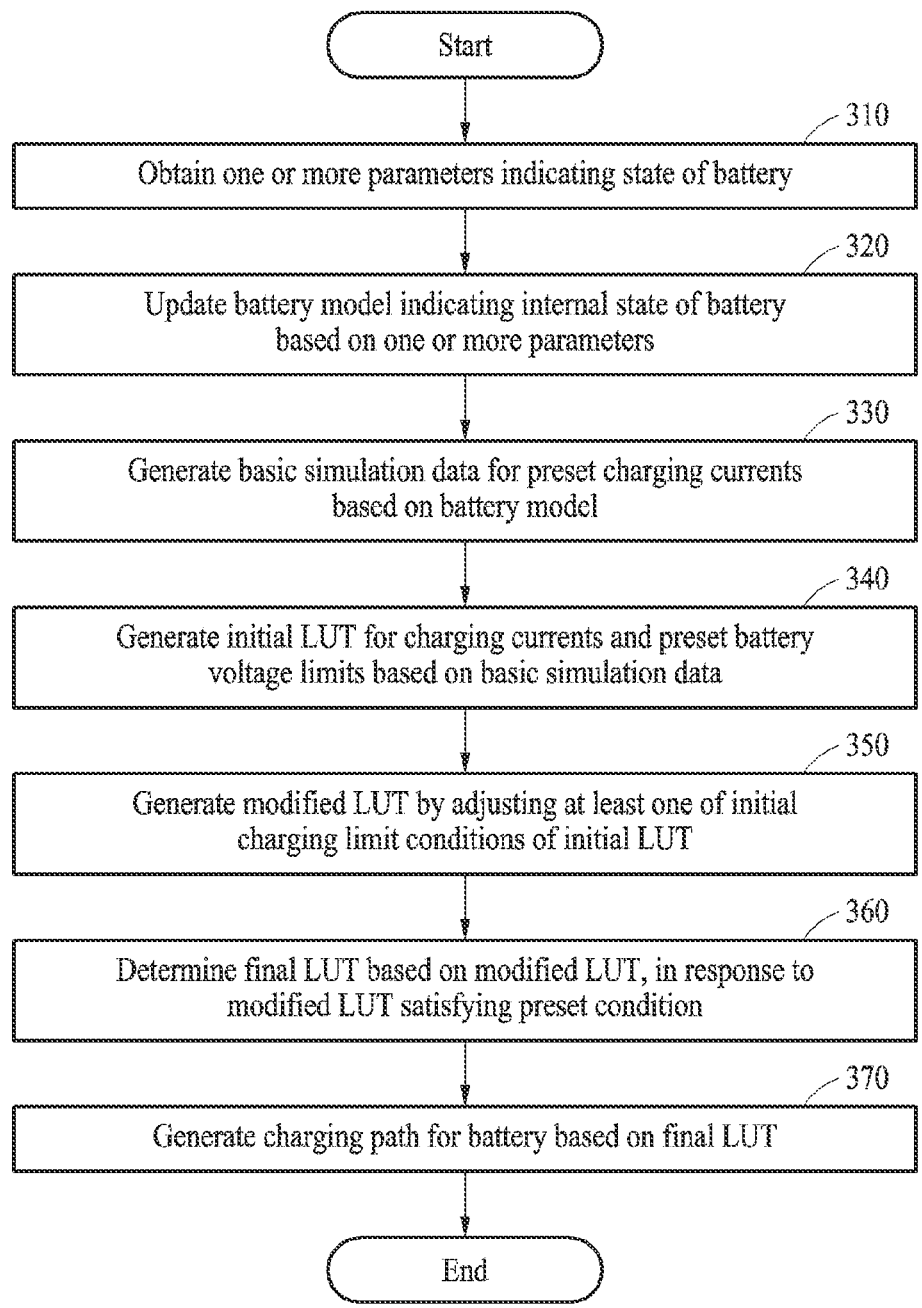
FIG. 3 illustrates an example of a method of generating a charging path for a battery.

FIG. 3 illustrates an example of a method of generating a charging path for a battery. The operations in FIG. 3 may be performed in the sequence and manner as shown, although the order of some operations may be changed or some of the operations omitted without departing from the spirit and scope of the illustrative examples described. Many of the operations shown in FIG. 3 may be performed in parallel or concurrently. In addition to the description of FIG. 3 below, the descriptions of FIGS. 1-2 are also applicable to FIG. 3, and are incorporated herein by reference. Thus, the above description may not be repeated here.

One or more blocks of FIG. 3, and combinations of the blocks, can be implemented by special purpose hardware-based computer, such as a processor, that perform the specified functions, or combinations of special purpose hardware and computer instructions. For example, operations 310 through 370 described below are performed by the electronic device 200 described above with reference to FIG. 2.

In operation 310, the electronic device 200 obtains one or more parameters indicating a state of a battery (e.g., the battery 110 of FIG. 1). The parameters indicating the state of the battery may be referred to as aging parameters, wherein the aging parameters may include an electrode balance shift, a capacity for cathode active material, and an anode surface resistance of the battery.

In operation 320, the electronic device 200 may update a battery model indicating an internal state of the battery based on one or more parameters. For example, the battery model may be an electrochemical model that estimates an internal state of a battery based on various parameters. The battery model may estimate internal state information of the battery by modeling an internal physical phenomenon, such as a potential or an ion concentration distribution, of the battery.

The battery model may be employed in various manners to express the internal state of the battery. For example, a single particle model (SPM) and various application models may be employed for the electrochemical model, and parameters defining the electrochemical model may be variously modified depending on examples.

For example, the internal state of the battery estimable by the model may include any one or any combination of a cathode lithium ion concentration distribution, an anode lithium ion concentration distribution, an electrolyte lithium ion concentration distribution, a cathode potential, and an anode potential thereof.

As the parameters of the model are adjusted based on the aging parameters, the internal state of the battery estimated by the model may be changed.

In operation 330, the electronic device 200 generates basic simulation data for preset charging currents based on the battery model. For example, the preset charging currents may include 7.92 amperes (A), 7.57 A, 7.12 A, 6.67 A, 6.23 A, 5.79 A, 5.34 A, 4.89 A, and 4.45 A.

In an example, the electronic device 200 may generate basic simulation data for a partial stage as a fast charging stage of a total charge capacity of the battery. For example, the fast charging stage of the total charging capacity may include a state of charge (SOC) ranging from 0.04 to 0.71. For example, a maximum charging time and battery voltage limits for the charging currents may be set to generate the basic simulation data.

In an example, first basic simulation data indicating an internal state of the battery may be generated by charging the battery with a first charging current in the fast charging stage. For example, if the fast charging stage includes an SOC ranging from 0.04 to 0.71, the generation of the first basic simulation data may be terminated in response to the SOC reaching 0.71 or the voltage of the battery reaching a first battery voltage limit set for the first charging current. For example, if the number of preset charging currents is n, n pieces of basic simulation data may be generated.

In an example, a side reaction current may be calculated based on basic simulation data. For example, the side reaction current may be calculated based on the Butler-Volmer equation.

The Butler-Volmer equation obtains an amount of lithium ions consumed by an anode side reaction (that is, an amount of anode side reaction) and may be expressed by Equation 1.

$$j_{side}^{Li} = a_s i_{0,side}\left[\exp\left(\frac{\alpha_{a,side} n_{side} F}{RT}\eta_{side}\right) - \exp\left(-\frac{\alpha_{c,side} n_{side} F}{RT}\eta_{side}\right)\right] \quad \text{[Equation 1]}$$

In Equation 1, $j_{side}^{Li}$ denotes an electrode current density related to lithium ion consumption by an anode side reaction, wherein the amount of lithium ions consumed by the anode side reaction may be obtained by integrating $j_{side}^{Li}$ with respect to time. $a_s$ denotes an active surface area of the anode, and $i_{0,side}$ denotes an exchange current density for the anode side reaction. $\alpha_{a,side}$ denotes an anodic charge transfer coefficient, and $\alpha_{c,side}$ denotes a cathodic charge transfer coefficient, wherein each may have a value of 0.5, for example. $n_{side}$ denotes the number of molecules involved in the anode side reaction, F denotes the Faraday constant, R denotes an ideal gas constant, and T denotes the temperature. $\eta_{side}$ denotes an anode overpotential for the side reaction and may be expressed by Equation 2.

$$\eta_{side} = \phi_s - \phi_e - U_{eq,side} - \frac{R_{SEI,total}}{a_{s,side}} j_{total}^{Li} \quad \text{[Equation 2]}$$

In Equation 2, $\phi_s$ denotes a potential of a solid, and $\phi_e$ denotes a potential of an electrolyte. $U_{eq,side}$ denotes the equilibrium potential for the side reaction and may be set to 0.4 V, for example. $R_{SEI,total}$ denotes the resistance by the SEI layer formed on the anode surface, $a_{s,side}$ denotes the active surface area of the anode, and $j_{total}^{Li}$ denotes the electrode current density related to all lithium ions.

The exchange current density $i_{0,side}$ described above may be expressed by Equation 3.

$$i_{0,side} = k_{side}\sqrt{c_{s,surf} c_{EC,R_s}} \quad \text{[Equation 3]}$$

In Equation 3, $k_{side}$ denotes a kinetic rate constant for the side reaction, $c_{s,surf}$ denotes the lithium ion concentration on the electrode (for example, anode) surface, and $c_{EC,R}$ denotes the electrolyte concentration on the electrode surface.

In operation 340, the electronic device 200 generates an initial look-up table (LUT) for the charging currents and the preset battery voltage limits based on the basic simulation data.

In an example, the preset charging currents may include 7.92 A, 7.57 A, 7.12 A, 6.67 A, 6.23 A, 5.79 A, 5.34 A, 4.89 A, and 4.45 A. The initial LUT for the preset charging currents is shown in FIG. 8.

The preset charging currents may be used to charge the battery in the fast charging stage, and the fast charging stage may be divided into stages in which the charging currents are used. For example, a stage in which 7.92 A is used may be defined as a first stage, a stage in which 7.57 A is used may be defined as a second stage, a stage in which 7.12 A is used may be defined as a third stage, a stage in which 6.67 A is used may be defined as a fourth stage, a stage in which 6.23 A is used may be defined as a fifth stage, a stage in which 5.79 A is used may be defined as a sixth stage, a stage in which 5.34 A is used may be defined as a seventh stage, a stage in which 4.89 A is used may be defined as an eighth stage, and a stage in which 4.45 A is used may be defined as a ninth stage.

For example, the first stage may correspond to a period from a start point of the fast charging stage to a point in time at which the voltage of the battery reaches 4.130 V while the battery is being charged with 7.92 A. The second stage may correspond to a period from an end point of the first stage to a point in time at which the voltage of the battery reaches 4.130 V while the battery is being charged with 7.57 A. The third stage may correspond to a period from an end point of the second stage to a point in time at which the voltage of the battery reaches 4.130 V while the battery is being charged with 7.12 A. The fourth stage may correspond to a period from an end point of the third stage to a point in time at which the voltage of the battery reaches 4.300 V while the battery is being charged with 6.67 A. The fifth stage may correspond to a period from an end point of the fourth stage to a point in time at which the voltage of the battery reaches 4.300 V while the battery is being charged with 6.23 A. The sixth stage may correspond to a period from an end point of the fifth stage to a point in time at which the voltage of the battery reaches 4.300 V while the battery is being charged with 5.79 A. The seventh stage may correspond to a period from an end point of the sixth stage to a point in time at which the voltage of the battery reaches 4.300 V while the battery is being charged with 5.34 A. The eighth stage may correspond to a period from an end point of the seventh stage to a point in time at which the voltage of the battery reaches 4.300 V while the battery is being charged with 4.89 A. The ninth stage may correspond to a period from an end point of the eighth stage to a point in time at which the voltage of the battery reaches 4.380 V while the battery is being charged with 4.45 A.

An initial LUT 810 may be generated to represent initial charging limit conditions 820 of the battery for the stages corresponding to the charging currents. For example, the initial charging limit conditions 820 may be anode potentials of the battery. However, examples are not limited thereto.

The initial LUT 810 may further include, as charging results 830, a charging time and an aging rate when the battery is charged with a charging path according to the initial LUT 810. An example of calculating the charging time and the aging rate as the charging results 830 will be described in detail below with reference to FIG. 7.

In operation 350, the electronic device 200 may generate a modified LUT by adjusting at least one of the initial charging limit conditions of the initial LUT.

The electronic device 200 may determine whether a charging result according to the charging path of the initial LUT satisfies a threshold, and generate a modified LUT by adjusting at least one of the initial charging limit conditions of the initial LUT, in response to the charging result failing to satisfy the threshold. For example, the initial charge limit condition may be an anode potential. For example, the threshold may be whether a total charging time for the fast charging stage elapses a preset time.

For example, an anode potential limit of the first stage (e.g., the stage in which the charging current of 7.92 A is used), among the stages of the fast charging stage, may be adjusted from 0.061 V to 0.062 V. In this case, the initial LUT and the modified LUT may be referred to as the first LUT and the second LUT, respectively.

In an example, a charging limit condition for any one stage (i.e., target stage), among the stages of the fast charging stage, may be adjusted, and the charging limit conditions of the other stages may not be adjusted. For example, in the initial LUT 810 of FIG. 8, only an anode potential limit for the first stage may be adjusted, and anode potential limits for the second to ninth stages may not be adjusted. Hereinafter, an example of determining the target stage from among the stages will be described in detail with reference to FIGS. 9 to 12.

It may be determined for the modified LUT whether a charging result according to the charging path of the modified LUT satisfies the threshold, and a re-modified LUT may be generated by adjusting at least one of the charging limit conditions of the modified LUT in response to the charging result failing to satisfy the condition. In this case, the modified LUT and the re-modified LUT may be referred to as the second LUT and the third LUT, respectively.

In operation 360, the electronic device 200 determines a final LUT based on the modified LUT in response to the modified (or re-modified) LUT satisfying the threshold. For example, the threshold may be whether the charging time for the fast charging stage using the charging path of the modified LUT exceeds a preset time.

The electronic device 200 may determine the modified LUT (e.g., an n-th LUT) or a LUT (e.g., an (n-1)-th LUT) previous to the modified LUT as the final LUT. An example of determining the final LUT based on the modified LUT will be described in detail below with reference to FIGS. 13 and 14.

In operation 370, the electronic device 200 generates a charging path for the battery based on the final LUT. The charging path may be a path in which each of the stages of the fast charging stage is changed.

For example, the condition for changing from the first stage to the second stage in the charging path may be a charging limit condition for the first stage of the final LUT. For example, if the charging limit condition is an anode potential, and an anode potential of the battery estimated while the battery is charged with the first current (e.g., 7.92 A) reaches an anode potential limit for a first stage of the final LUT, the charging current may be changed from the first current to the second current (e.g., 7.57 A).

The battery and the electronic device 200 may be included in a terminal, and the terminal may charge the battery using the determined charging path. For example, when a power source is connected thereto, the terminal may estimate a current internal state of the battery, determine a stage of a charging path corresponding to the estimated internal state, and charge the battery using a current corresponding to the determined stage.

Figure 4:
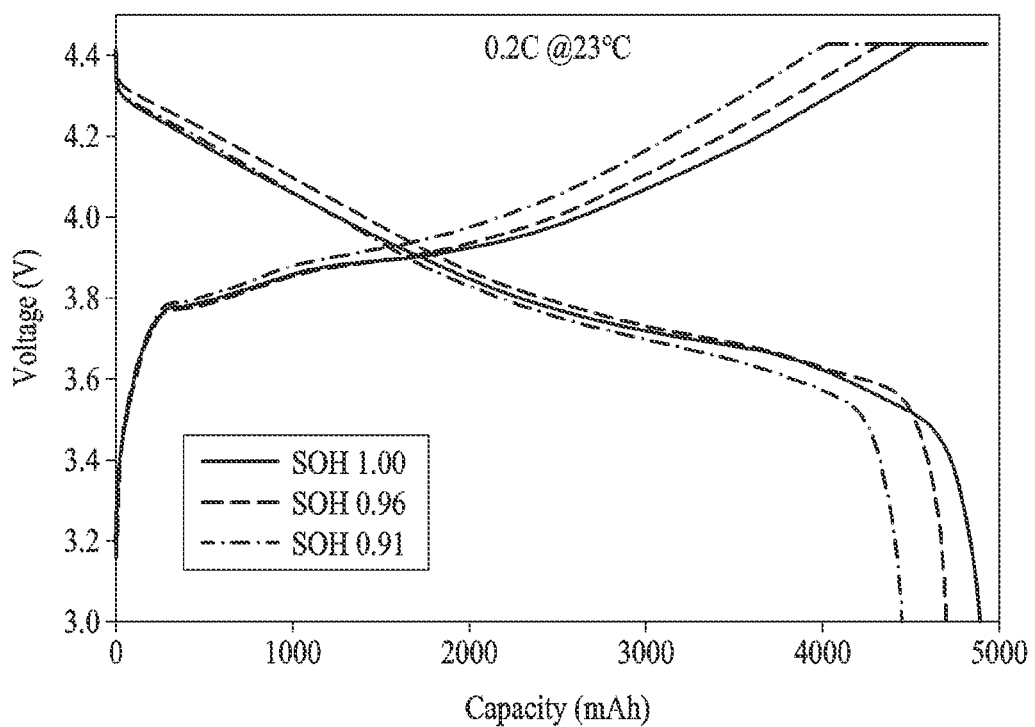
FIG. 4 illustrates an example of a voltage of a battery with respect to a capacity of the battery according to a degree of aging of the battery.

FIG. 4 illustrates an example of a voltage of a battery with respect to a capacity of the battery according to a degree of aging of the battery.

A state of health is a parameter quantitatively indicating a change in the life characteristic of a battery caused by aging, and may indicate a degree of degradation in the life or capacity of the battery. Various schemes may be employed to estimate or measure an SOH.

The graph of FIG. 4 shows that the lower the SOH, the higher the voltage of the battery at the same capacity of the battery.

Figure 5:
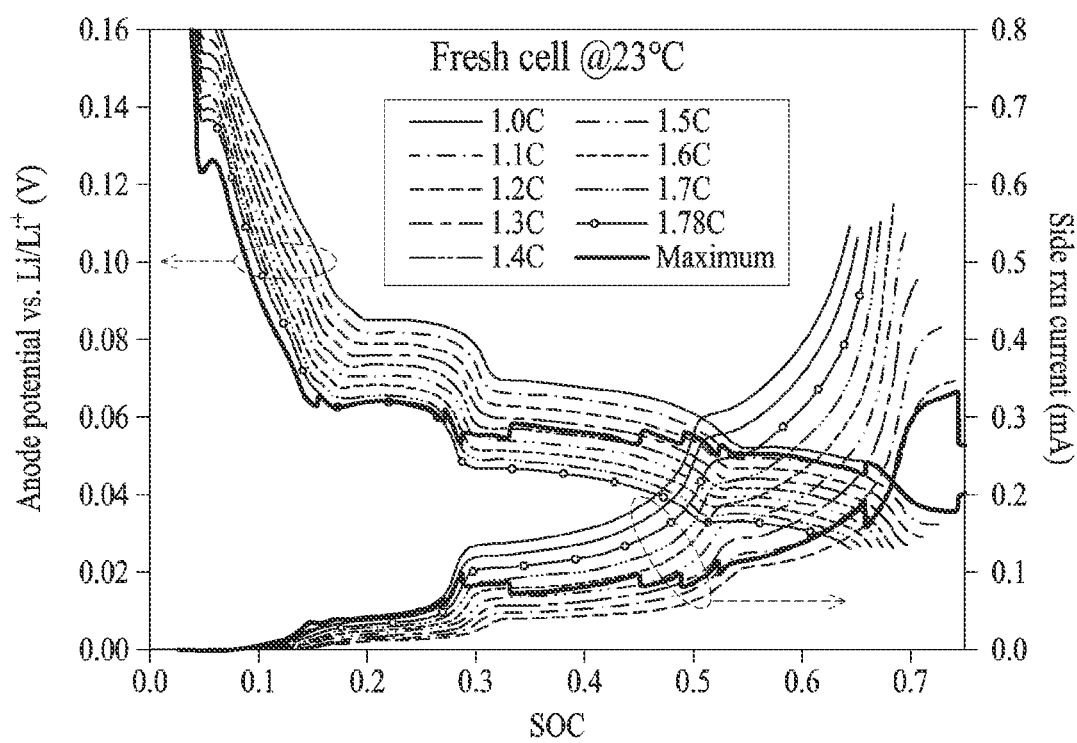
FIG. 5 illustrates examples of basic simulation data for charging currents.

FIG. 5 illustrates examples of basic simulation data for charging currents.

Examples of basic simulation data generated by operation 330 described above with reference to FIG. 3 are shown in FIG. 5. 7.92 A, 7.57 A, 7.12 A, 6.67 A, 6.23 A, 5.79 A, 5.34 A, 4.89 A, and 4.45 A correspond to 1.78 C, 1.7 C, 1.6 C, 1.5 C, 1.4 C, 1.3 C, 1.2 C, 1.1 C, and 1.0 C, respectively.

Additionally, side reaction currents calculated based on the basic simulation data are also shown in FIG. 5.

Figure 6:
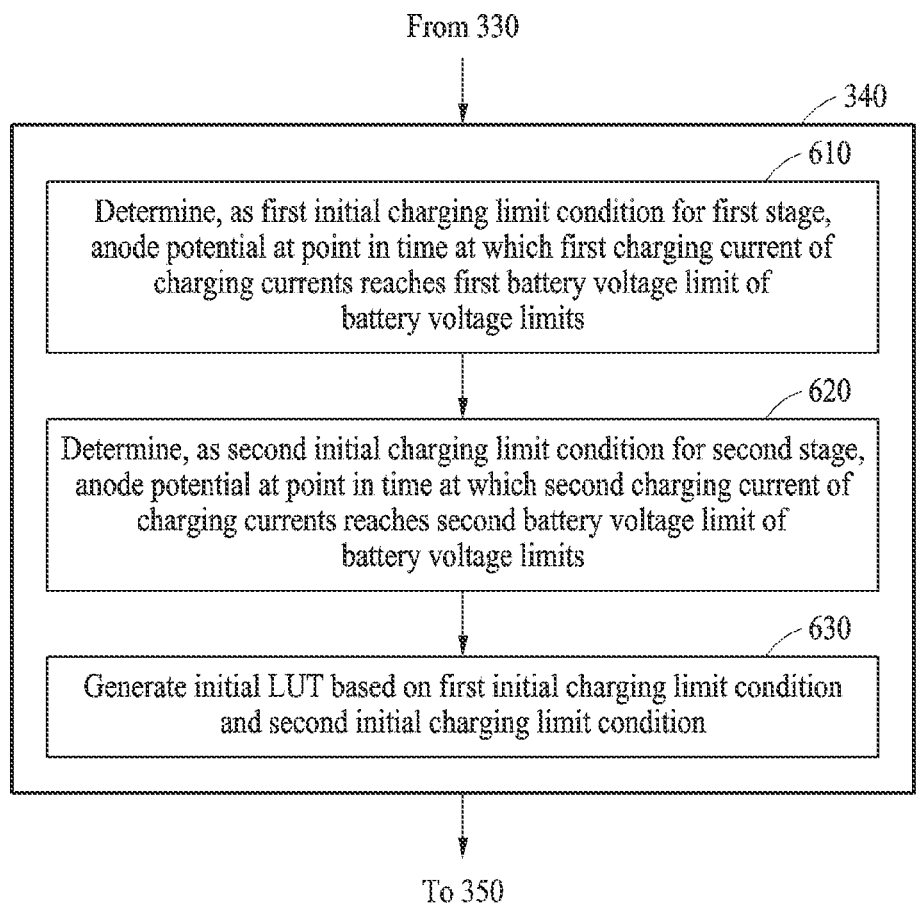
FIG. 6 illustrates an example of generating an initial look-up table (LUT).

FIG. 6 illustrates an example of generating an initial look-up table (LUT). The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer, such as a processor, that perform the specified functions, or combinations of special purpose hardware and computer instructions. In addition to the description of FIG. 6 below, the descriptions of FIGS. 1-5 are also applicable to FIG. 6, and are incorporated herein by reference. Thus, the above description may not be repeated here.

Referring to FIG. 6, operation 340 described above with reference to FIG. 3 may include operations 610 to 630.

In operation 610, the electronic device 200 determines, as a first initial charging limit condition for a first stage, an anode potential at a point in time at which a first charging current of the preset charging currents reaches a first battery voltage limit of the preset battery voltage limits. Although it is described that the initial charging limit condition is an anode potential, examples are not limited thereto. For example, the initial charging limit condition may be one or more of the estimated internal states of the battery.

In operation 620, the electronic device 200 determines, as a second initial charging limit condition for a second stage, an anode potential at a point in time at which a second charging current of the preset charging currents reaches a second battery voltage limit of the preset battery voltage limits.

In operation 630, the electronic device 200 generates an initial LUT based on the first initial charging limit condition and the second charging limit condition. For example, the initial LUT 810 may be generated to include the initial charging limit conditions 820 of FIG. 8.

Figure 7:
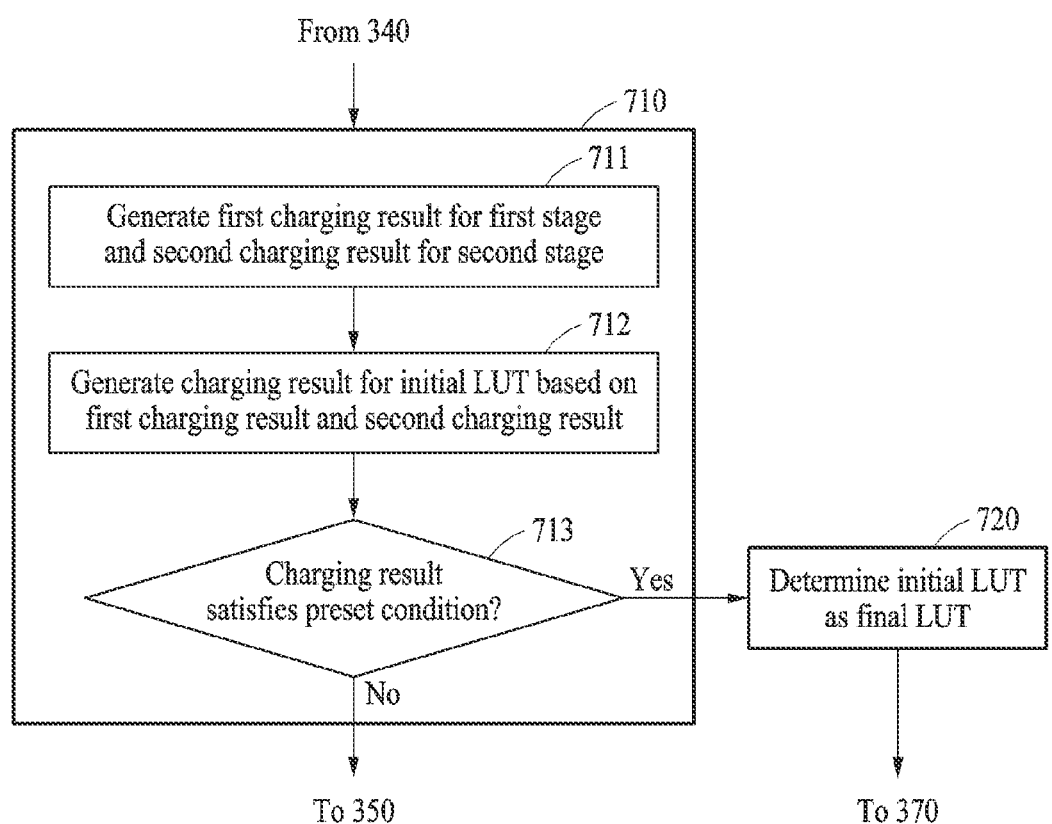
FIG. 7 illustrates an example of determining whether an initial LUT satisfies a threshold.

FIG. 7 illustrates an example of determining whether an initial LUT satisfies a threshold. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. One or more blocks of FIG. 7, and combinations of the blocks, can be implemented by special purpose hardware-based computer, such as a processor, that perform the specified functions, or combinations of special purpose hardware and computer instructions. In addition to the description of FIG. 7 below, the descriptions of FIGS. 1-6 are also applicable to FIG. 7, and are incorporated herein by reference. Thus, the above description may not be repeated here.

Referring to FIG. 7, the method of generating a charging path for a battery described above with reference to FIG. 3 may further include operations 710 and 720. Operation 710 may include operations 711 to 713.

In operation 711, the electronic device 200 generates a first charging result for a first stage and a second charging result for a second stage. For example, a charging result for a predetermined stage may be a partial charging time of the predetermined stage. In another example, the charging result for the predetermined stage may be an aging rate of the predetermined stage. The aging rate may correspond to an amount of anode side reaction.

In operation 712, the electronic device 200 generates a charging result for the initial LUT based on the first charging result and the second charging result. For example, the charging result may be generated by accumulating the first charging result and the second charging result.

In operation 713, the electronic device 200 determines whether the charging result of the initial LUT satisfies a threshold. For example, a total charging time (e.g., 30 minutes) may be set as the threshold, and whether the charging result according to the initial LUT exceeds 30 minutes may be determined.

When the charging result of the initial LUT does not satisfy the threshold, operation 350 described above with reference to FIG. 3 may be performed. In another example, when the charging result of the initial LUT satisfies the threshold, operation 720 may be performed.

In operation 720, the electronic device 200 may determine the initial LUT as the final LUT.

The initial LUT may correspond to a charging path that minimizes a charging time of the battery in the currently aged state of the battery. The charging path that minimizes the charging time may be a charging path that maximizes the aging rate. That is, the charging time and the aging rate may have a trade-off relationship. For example, when the charging time is set to be short as the threshold, the charging result of the initial LUT may immediately satisfy the threshold. In this case, the initial LUT may be determined as the final LUT.

After operation 720 is performed, operation 370 described above with reference to FIG. 3 may be performed.

FIG. 8 illustrates an example of an initial LUT.

Referring to FIG. 8, the initial LUT 810 may include the initial charging limit conditions 820 and the charging results 830.

For example, the initial charge limit conditions 820 may be anode potentials of the battery for respective stages.

For example, the charging results 830 may include the charging time and the aging rate according to the charging path of the initial LUT.

Figure 9:
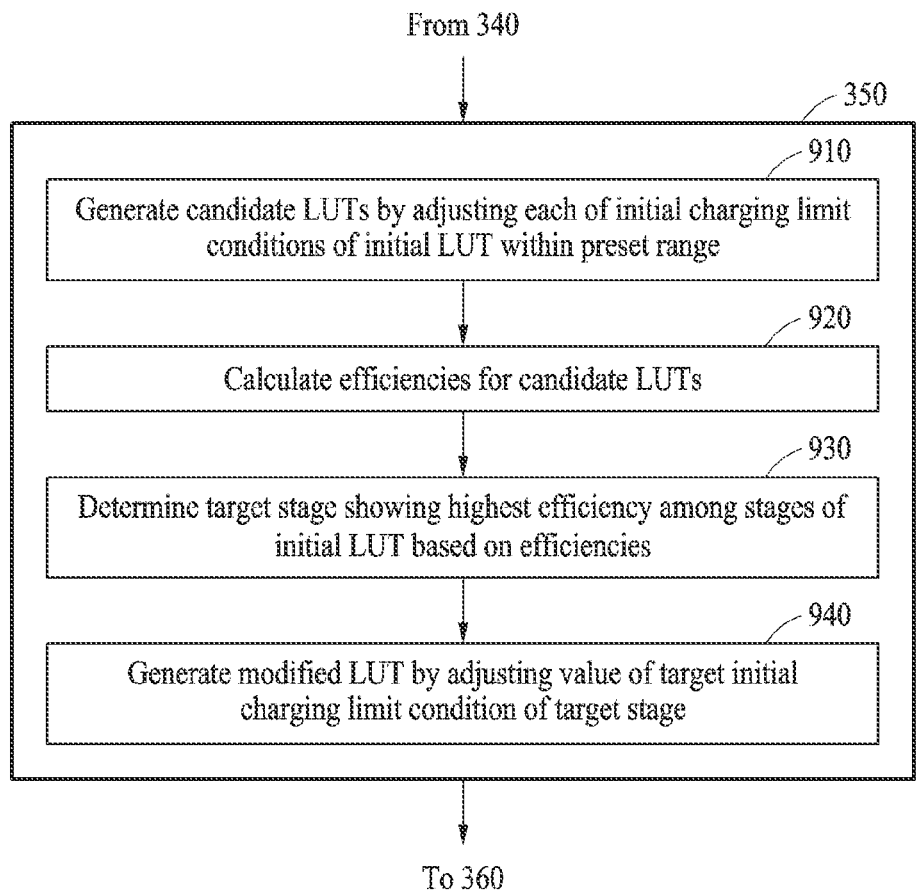
FIG. 9 illustrates an example of generating a modified LUT based on an initial LUT.

FIG. 9 illustrates an example of generating a modified LUT based on an initial LUT. The operations in FIG. 9 may be performed in the sequence and manner as shown, although the order of some operations may be changed or some of the operations omitted without departing from the spirit and scope of the illustrative examples described. Many of the operations shown in FIG. 9 may be performed in parallel or concurrently. One or more blocks of FIG. 9, and combinations of the blocks, can be implemented by special purpose hardware-based computer, such as a processor, that perform the specified functions, or combinations of special purpose hardware and computer instructions. In addition to the description of FIG. 9 below, the descriptions of FIGS. 1-8 are also applicable to FIG. 9, and are incorporated herein by reference. Thus, the above description may not be repeated here.

Referring to FIG. 9, operation 350 described above with reference to FIG. 3 may include operations 910 to 940.

In operation 910, the electronic device 200 generating candidate LUTs by adjusting each of the initial charging limit conditions of the initial LUT within a preset range.

The charging limit conditions may be anode potentials, the preset range may be 10 mV, and the value of adjustment may be 1 mV. For example, if a first anode potential limit for a first stage is 0.061 V, ten candidate LUTs in which the first anode potential limit is adjusted to 0.062 V, 0.063 V, 0.064 V, 0.065 V, 0.066 V, 0.067 V, 0.068 V, 0.069 V, 0.070 V, and 0.071 V may be generated. Anode potential limits for the stages other than the first stage may not be adjusted. For example, when there are 9 stages, there may be 9×10 candidate LUTs for the initial LUT.

In operation 920, the electronic device 200 calculates efficiencies for the candidate LUTs. An example of calculating the efficiencies for the candidate LUTs will be described in detail below with reference to FIG. 10.

In operation 930, the electronic device 200 determines a target stage showing a highest efficiency from among the stages of the initial LUT based on the calculated efficiencies. For example, when a candidate LUT showing a highest efficiency among the 90 candidate LUTs is a LUT in which an anode potential limit of the second stage is adjusted from 0.061 V to 0.068 V, the second stage may be determined as the target stage.

In operation 940, the electronic device 200 may generate the modified LUT by adjusting a value of a target initial charging limit condition of the target stage. For example, the value of the target initial charge limit condition may be adjusted by a preset value (e.g., 1 mV). In this example, if the second stage is determined as the target stage, the initial anode potential limit of the second stage may be adjusted from 0.061 V to 0.062 V.

Figure 10:
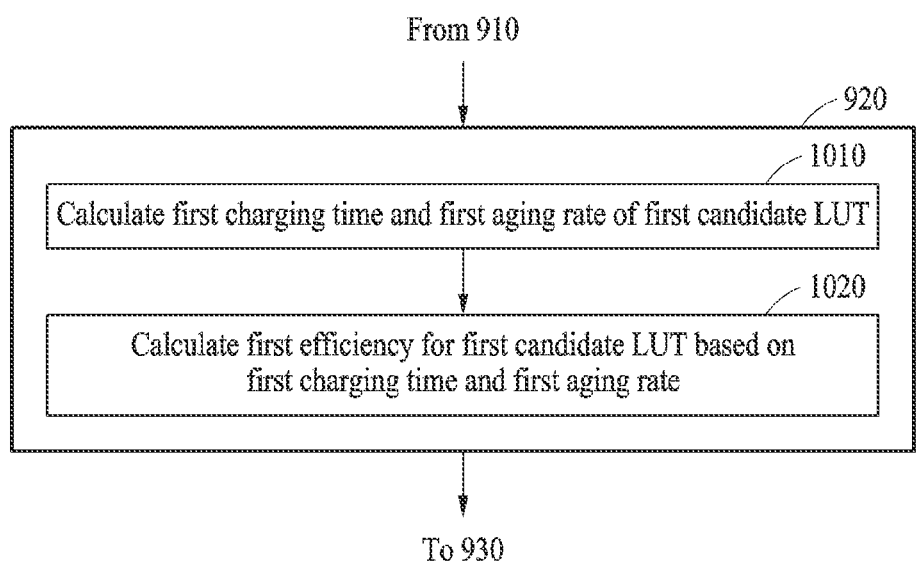
FIG. 10 illustrates an example of calculating an efficiency for a candidate LUT for an initial LUT.

FIG. 10 illustrates an example of calculating an efficiency for a candidate LUT for an initial LUT. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. One or more blocks of FIG. 10, and combinations of the blocks, can be implemented by special purpose hardware-based computer, such as a processor, that perform the specified functions, or combinations of special purpose hardware and computer instructions. In addition to the description of FIG. 10 below, the descriptions of FIGS. 1-9 are also applicable to FIG. 10, and are incorporated herein by reference. Thus, the above description may not be repeated here.

Referring to FIG. 10, operation 920 described above with reference to FIG. 9 may include operations 1010 and 1020.

In operation 1010, the electronic device 200 calculates a first charging time and a first aging rate of a first candidate LUT of the candidate LUTs.

An example of calculating the first charging time and the first aging rate of the first candidate LUT will be described in detail below with reference to FIG. 11.

In operation 1020, the electronic device 200 calculates a first efficiency for the first candidate LUT based on a reference aging rate, a reference charging time, the first charging time, and the first aging rate. The reference aging rate and the reference charging time may be an aging rate and a charging time by the charging limit conditions of the initial LUT. For example, the first efficiency may be calculated by Equation 4.

$$\text{First Efficiency} = \frac{\text{Reference aging rate} - \text{First aging rate}}{\text{First charging time} - \text{Reference charging time}} \qquad \text{[Equation 4]}$$

The example of calculating the efficiency for the candidate LUT for the initial LUT has been described with reference to FIG. 10. However, the description may similarly apply to an example of calculating an efficiency for a candidate LUT for the modified LUT (e.g., the second LUT). In this case, the reference aging rate and the reference charging time may correspond to an aging rate and a charging time by the charging limit conditions of the modified LUT.

Figure 11:
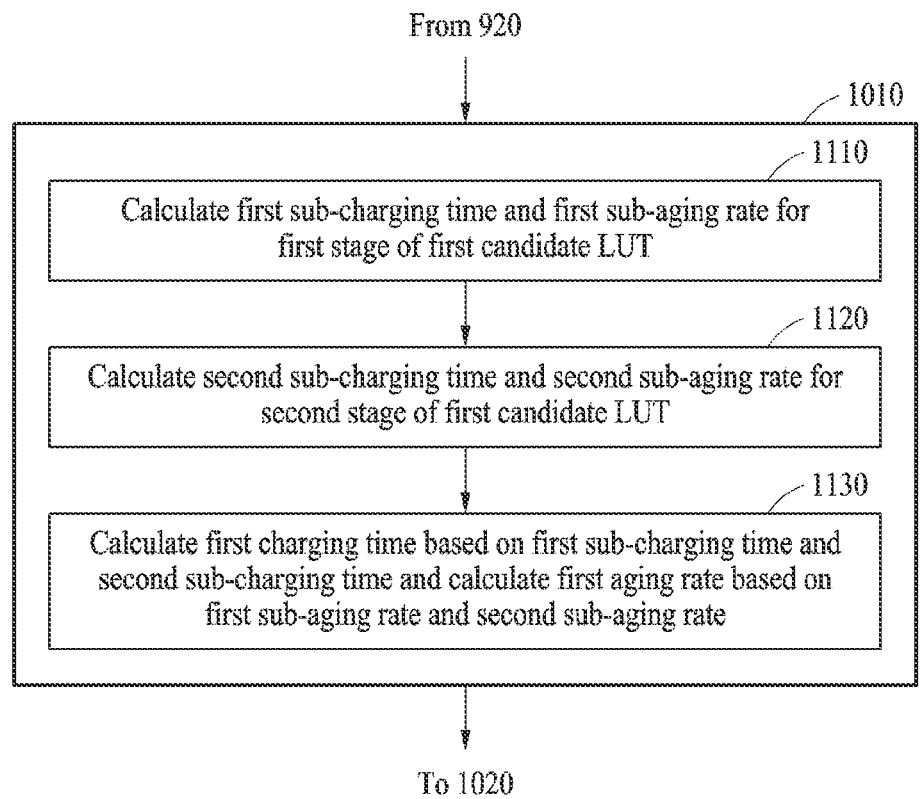
FIG. 11 illustrates an example of calculating an aging rate of a candidate LUT.

FIG. 11 illustrates an example of calculating an aging rate of a candidate LUT. The operations in FIG. 11 may be performed in the sequence and manner as shown, although the order of some operations may be changed or some of the operations omitted without departing from the spirit and scope of the illustrative examples described. Many of the operations shown in FIG. 11 may be performed in parallel or concurrently. One or more blocks of FIG. 11, and combinations of the blocks, can be implemented by special purpose hardware-based computer, such as a processor, that perform the specified functions, or combinations of special purpose hardware and computer instructions. In addition to the description of FIG. 11 below, the descriptions of FIGS. 1-10 are also applicable to FIG. 11, and are incorporated herein by reference. Thus, the above description may not be repeated here.

Referring to FIG. 11, operation 1010 described above with reference to FIG. 10 may include operations 1110 to 1130.

In operation 1110, the electronic device 200 calculates a first sub-charging time and a first sub-aging rate for a first stage of the first candidate LUT. For example, the first sub-charging time may be a time from a start point of the first stage to a start point of the second stage. For example, the first sub-aging rate may be calculated based on a side reaction current generated in the first stage.

In operation 1120, the electronic device 200 calculates a second sub-charging time and a second sub-aging rate for a second stage of the first candidate LUT. For example, the second sub-charging time may be a time from the start point of the second stage to a start point of the third stage. For example, the second sub-aging rate may be calculated based on a side reaction current generated in the second stage.

In operation 1130, the electronic device 200 calculates the first charging time of the first candidate LUT based on the first sub-charging time and the second sub-charging time and calculates the first aging rate of the first candidate LUT based on the first sub-aging rate and the second sub-aging rate.

For example, the first charging time may be calculated by accumulating the first sub-charging time and the second sub-charging time. For example, the first aging rate may be calculated by accumulating the first sub-aging rate and the second sub-aging rate.

The example of calculating the first charging time and the first aging rate of the first candidate LUT has been described with reference to FIG. 11. However, the description may similarly apply to an example of calculating a charging time and an aging rate of each of the initial LUT and the modified LUT.

Figure 12:
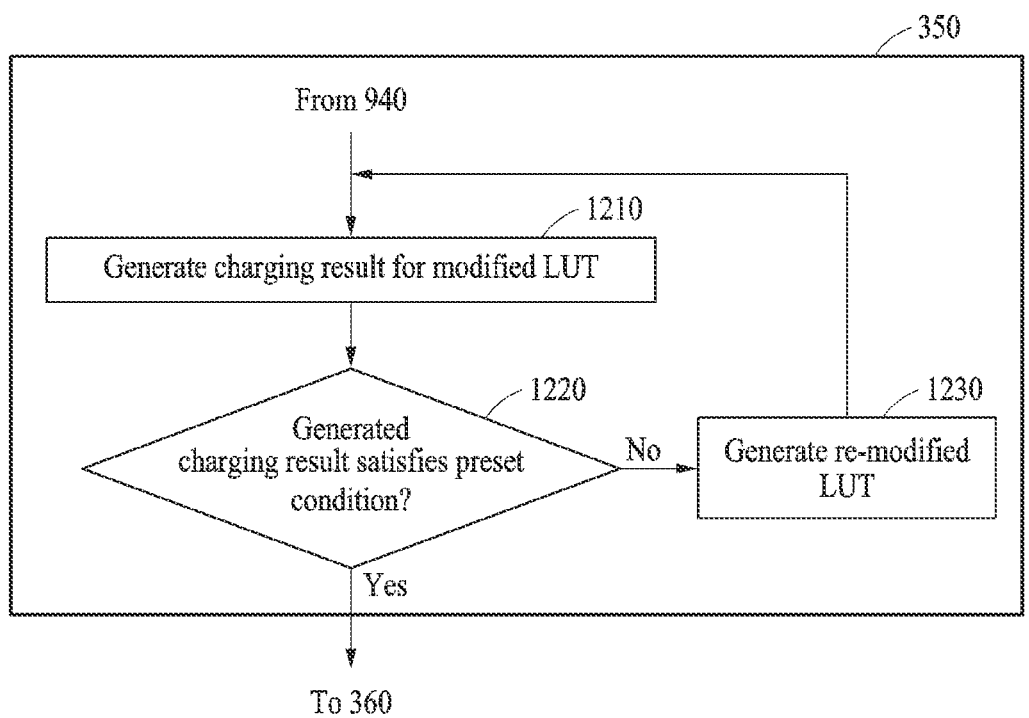
FIG. 12 illustrates an example of generating a re-modified LUT based on a modified LUT.

FIG. 12 illustrates an example of generating a re-modified LUT based on a modified LUT. The operations in FIG. 12 may be performed in the sequence and manner as shown, although the order of some operations may be changed or some of the operations omitted without departing from the spirit and scope of the illustrative examples described. Many of the operations shown in FIG. 12 may be performed in parallel or concurrently. One or more blocks of FIG. 12, and combinations of the blocks, can be implemented by special purpose hardware-based computer, such as a processor, that perform the specified functions, or combinations of special purpose hardware and computer instructions. In addition to the description of FIG. 12 below, the descriptions of FIGS. 1-11 are also applicable to FIG. 12, and are incorporated herein by reference. Thus, the above description may not be repeated here.

Referring to FIG. 12, operation 350 described above with reference to FIGS. 3 and 9 may further include operations

1210 to 1230. After operation 940 described with reference to FIG. 9 is performed, operation 1210 may be performed.

In operation 1210, the electronic device 200 generates a charging result for the modified LUT.

The description of operation 1210 may be replaced with the description of operations 711 and 712 described above with reference to FIG. 7.

In operation 1220, the electronic device 200 determines whether the charging result of the modified LUT satisfies a threshold. For example, a total charging time (e.g., 30 minutes) may be set as the threshold, and whether the charging result according to the modified LUT exceeds 30 minutes may be determined.

The description of operation 1220 may be replaced with the description of operation 713 described above with reference to FIG. 7.

When the charging result of the modified LUT satisfies the threshold, operation 360 described above with reference to FIG. 3 may be performed. When the charging result of the modified LUT fails to satisfy the threshold, operation 1230 may be performed.

In operation 1230, the electronic device 200 may generate a re-modified LUT by adjusting at least one of charging limit conditions of the modified LUT. The description of the example of generating the re-modified LUT may be replaced with the description of operations 910 to 940 described above with reference to FIG. 9.

Iteratively modified LUTs will be described in detail below with reference to FIG. 14.

Figure 13:
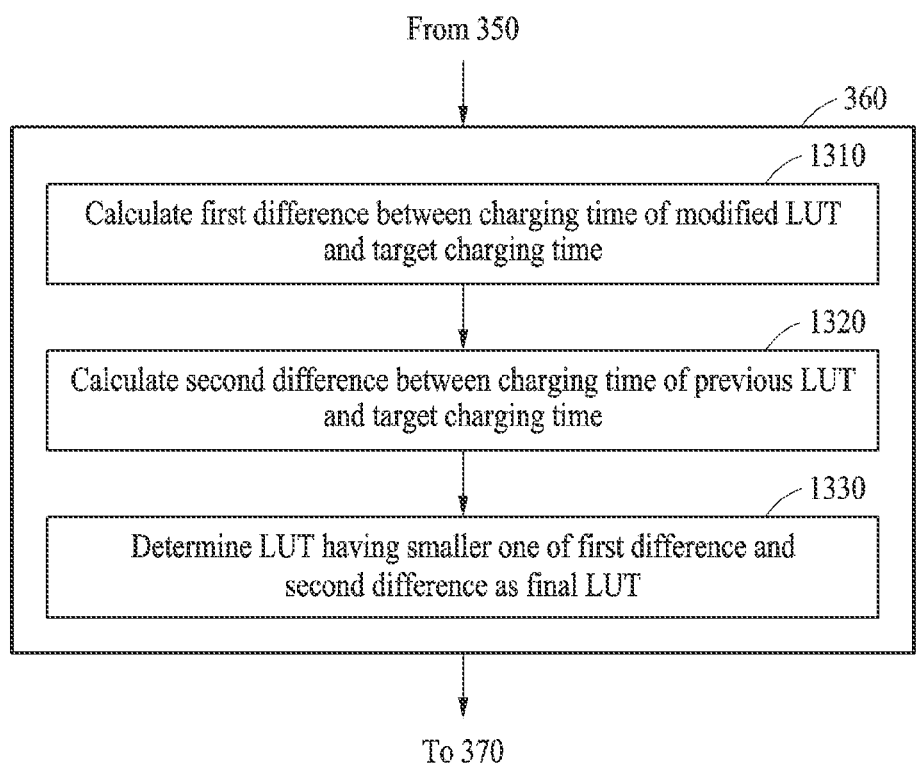
FIG. 13 illustrates an example of determining a final LUT from between a modified LUT and a LUT previous to the modified LUT.

FIG. 13 illustrates an example of determining a final LUT from between a modified LUT and a LUT previous to the modified LUT. The operations in FIG. 13 may be performed in the sequence and manner as shown, although the order of some operations may be changed or some of the operations omitted without departing from the spirit and scope of the illustrative examples described. Many of the operations shown in FIG. 13 may be performed in parallel or concurrently. One or more blocks of FIG. 13, and combinations of the blocks, can be implemented by special purpose hardware-based computer, such as a processor, that perform the specified functions, or combinations of special purpose hardware and computer instructions. In addition to the description of FIG. 13 below, the descriptions of FIGS. 1-12 are also applicable to FIG. 13, and are incorporated herein by reference. Thus, the above description may not be repeated here.

Referring to FIG. 13, operation 360 described above with reference to FIG. 3 may include operations 1310 to 1330.

In operation 1310, the electronic device 200 calculates a first difference between a charging time of the modified LUT and a target charging time. For example, if the charging time of the modified LUT is 30.08 minutes, and the target charging time is 30 minutes, the first difference may be calculated as 0.08 minutes.

In operation 1320, the electronic device 200 calculates a second difference between a charging time of a LUT previous to the modified LUT and the target charging time. For example, if the charging time of the previous LUT is 29.98 minutes, and the target charging time is 30 minutes, the second difference may be calculated as 0.02 minutes.

In operation 1330, the electronic device 200 determines a LUT having a smaller one of the first difference and the second difference as the final LUT. In the above example, the first difference is 0.08 minutes, and the second difference is 0.02 minutes. Thus, the LUT previous to the modified LUT may be determined as the final LUT.

FIG. 14 illustrates examples of an initial LUT and multiple LUTs.

Referring to FIG. 14, when a target charging time is set to 30 minutes, it may be determined that a result of LUT64 1420 satisfies a threshold. For example, one of LUTs may be determined as a final LUT according to a preset policy.

For example, LUT64 1420 may be determined as the final LUT.

As another example, LUT63 1410, which is a LUT previous to LUT64 1420, may be determined as a final LUT.

As still another example, since a difference for LUT64 1420 is calculated as 0.08 minutes, and a difference for LUT63 1410, which is the LUT previous to LUT64 1420, is calculated as 0.02 minutes, LUT63 1410 may be determined as the final LUT.

Figure 15:
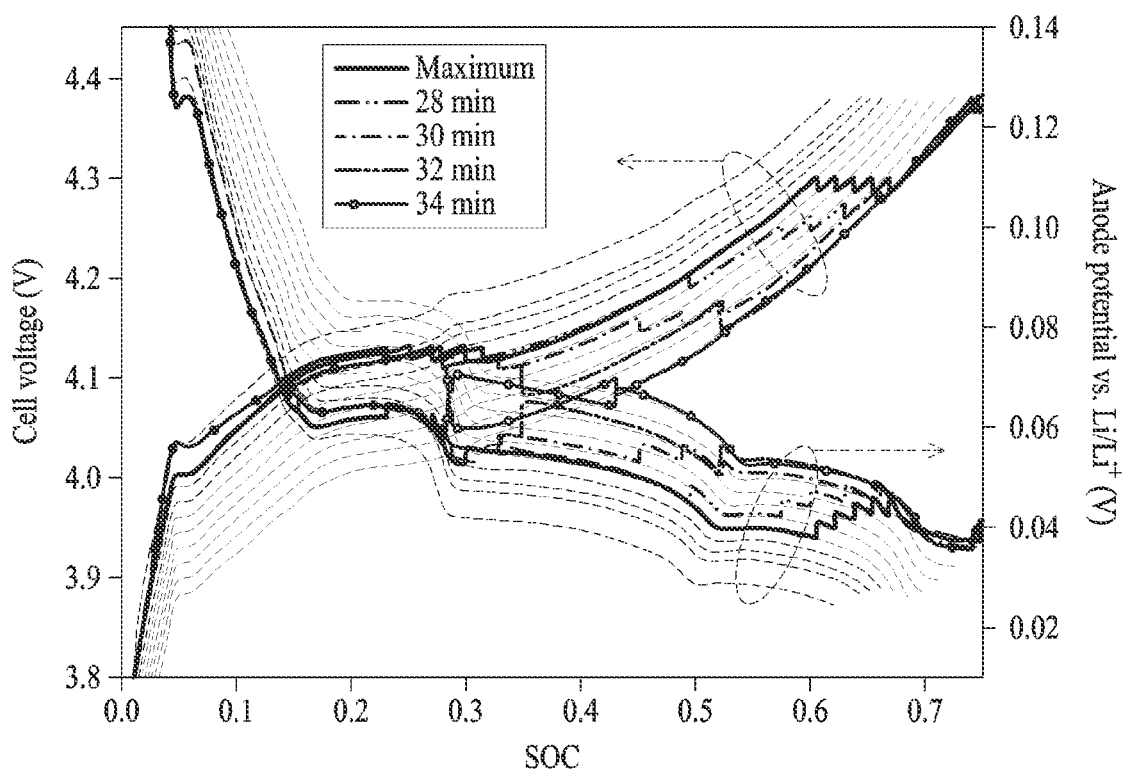
FIG. 15 illustrates an example of charging paths determined for preset target charging times with respect to a voltage and an anode potential of a battery.

FIG. 15 illustrates an example of charging paths determined for preset target charging times with respect to a voltage and an anode potential of a battery.

Referring to FIG. 15, it is shown that the higher the SOC, the lower the anode potential of the battery, and thus a side reaction current that increases when the anode potential is low increases as the SOC increases.

Figure 16:
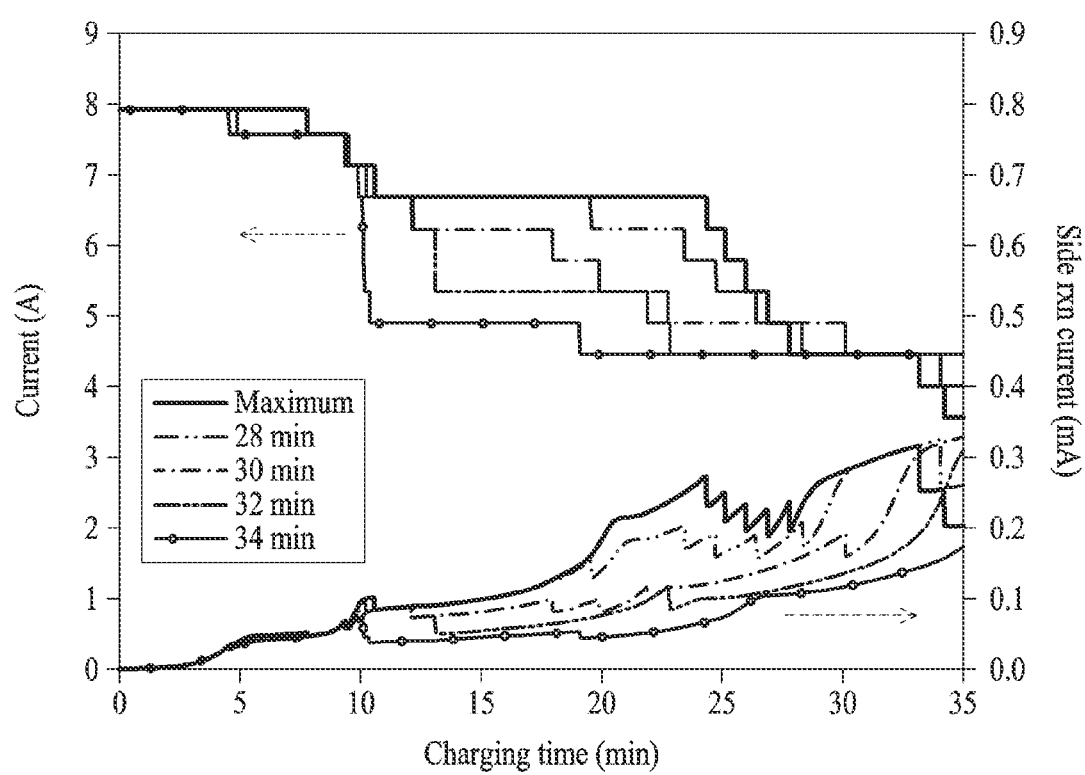
FIG. 16 illustrates an example of charging paths determined for preset target charging times with respect to charging currents and a side reaction current.

FIG. 16 illustrates an example of charging paths determined for preset target charging times with respect to charging currents and a side reaction current.

Referring to FIG. 16, it is shown that a high charging current is used relatively longer as a target charging time decreases. The longer the high charging current is used, the larger the side reaction current appears, resulting in an increase in the aging rate. Since the charging time and the aging rate are in a trade-off relationship, a charging path for charging the battery most efficiently (or while minimizing the aging rate) within a predetermined charging time is needed.

The charging path for charging the battery most efficiently within the predetermined charging time may be generated through operations 310 to 370 described above.

Figure 17:
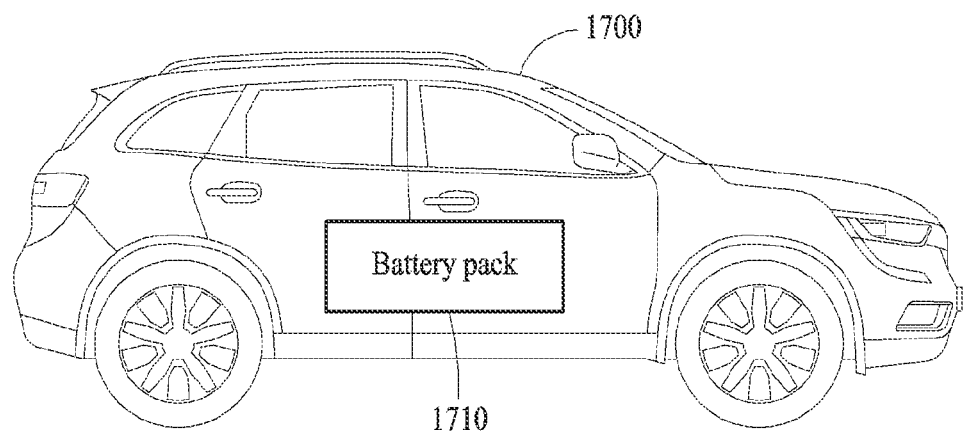
FIG. 17 illustrates an example of a vehicle.

FIG. 17 illustrates an example of a vehicle.

Referring to FIG. 17, a vehicle 1700 includes a battery pack 1710. The vehicle 1700 may be a vehicle using the battery pack 1710 as a power source. The vehicle 1700 may be, for example, any mode of transportation, delivery, or communication such as, for example, for example, a truck, a tractor, a scooter, a motorcycle, a cycle, an amphibious vehicle, a snowmobile, a boat, a public transit vehicle, a bus, a monorail, a train, a tram, an automobile, an autonomous vehicle, an unmanned aerial vehicle, a drone, an autonomous vehicle, an electric vehicle, or a hybrid vehicle.

The battery pack 1710 includes a battery management system (BMS) and battery cells (or battery modules). The BMS may monitor whether the battery pack 1710 shows an abnormality, and prevent over-charging or over-discharging of the battery pack 1710. Further, the BMS may perform thermal control for the battery pack 1710 when the temperature of the battery pack 1710 exceeds a first temperature (for example, 40° C.) or is less than a second temperature (for example, −10° C.). In addition, the BMS may perform cell balancing so that the battery cells in the battery pack 1710 have balanced charging states.

In an example, the vehicle 1700 may include a battery charging apparatus. The battery charging apparatus may generate a charging path of the battery pack 1710 (or the battery cells in the battery pack 1710), and charge the battery pack 1710 (or the battery cells in the battery pack 1710) using the generated charging path.

The description provided with reference to FIGS. 1 through 16 also applies to the description of FIG. 17, and thus a detailed description will be omitted for conciseness.

Figure 18:
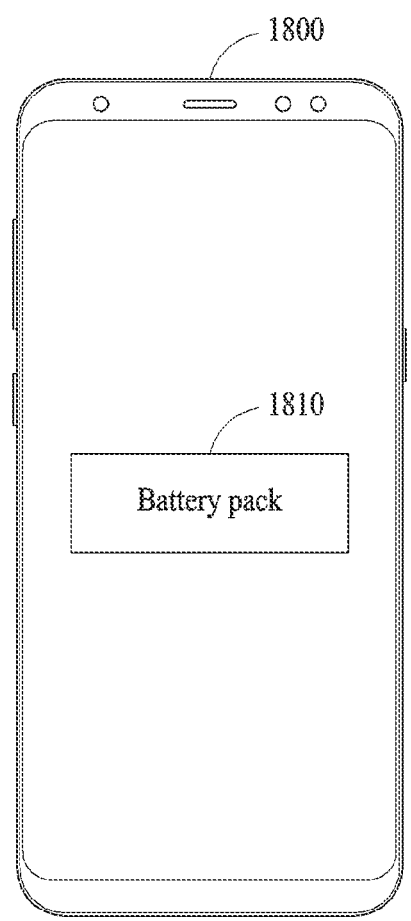
FIG. 18 illustrates an example of a mobile terminal.

FIG. 18 illustrates an example of a mobile terminal.

Referring to FIG. 18, a mobile terminal 1800 includes a battery pack 1810. The mobile terminal 1800 may be a device that uses the battery pack 1810 as a power source. The mobile terminal 1800 may be a portable terminal, such as, for example, an intelligent agent, a mobile phone, a cellular phone, a smart phone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera portable game console, an MP3 player, a portable/personal multimedia player (PMP), a handheld e-book, an ultra-mobile personal computer (UMPC), a portable lab-top PC, a global positioning system (GPS) navigation, a personal navigation device, portable navigation device (PND), a handheld game console, an e-book, a high definition television (HDTV), a smart appliance, communication systems, image processing systems, graphics processing systems, various Internet of Things (loT) devices that are controlled through a network, and other consumer electronics/information technology (CE/IT) devices.

The battery pack 1810 includes a BMS and battery cells (or battery modules).

In an example, the mobile terminal 1800 may include a battery charging apparatus. The battery charging apparatus may generate a charging path of the battery pack 1810 (or the battery cells in the battery pack 1810), and charge the battery pack 1810 (or the battery cells in the battery pack 1810) using the generated charging path.

The description provided with reference to FIGS. 1 through 17 also applies to the description of FIG. 18, and thus a detailed description will be omitted for conciseness.

Figure 19:
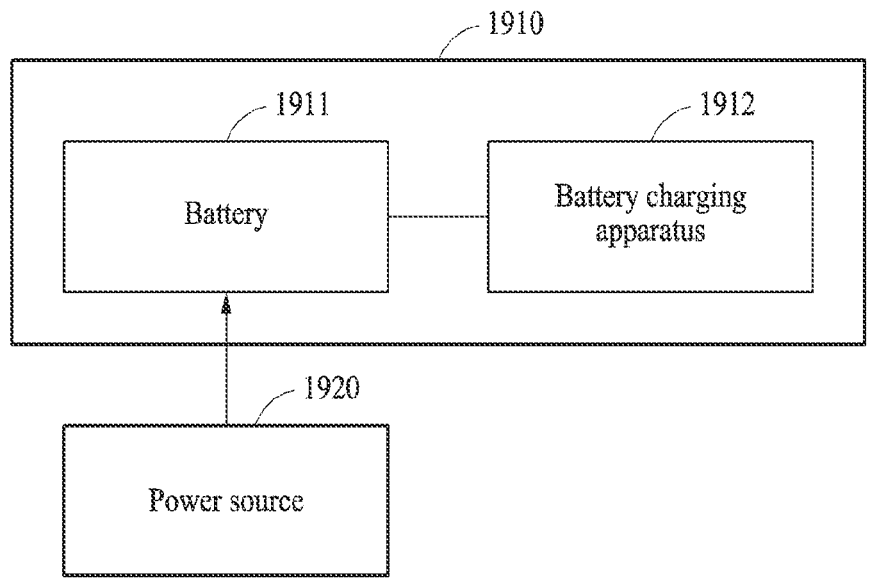
FIG. 19 illustrates an example of an electronic device.

FIG. 19 illustrates an example of an electronic device.

Referring to FIG. 19, a terminal 1910 includes a battery 1911 and a battery charging apparatus 1912. The terminal 1910 may be a mobile terminal such as a smart phone, a laptop, a tablet PC, or a wearable device, but is not limited thereto. The battery charging apparatus 1912 may be in the form of an integrated circuit (IC), but is not limited thereto. The battery charging apparatus 1912 may receive power from a power source 1920 in a wired or wireless manner and charge the battery 1911 using the power. The battery charging apparatus 1912 may generate a charging path for the battery 1911 and charge the battery 1911 using the charging path.

The description provided with reference to FIGS. 1 through 18 also applies to the description of FIG. 19, and thus a detailed description will be omitted for conciseness.

Figure 20:
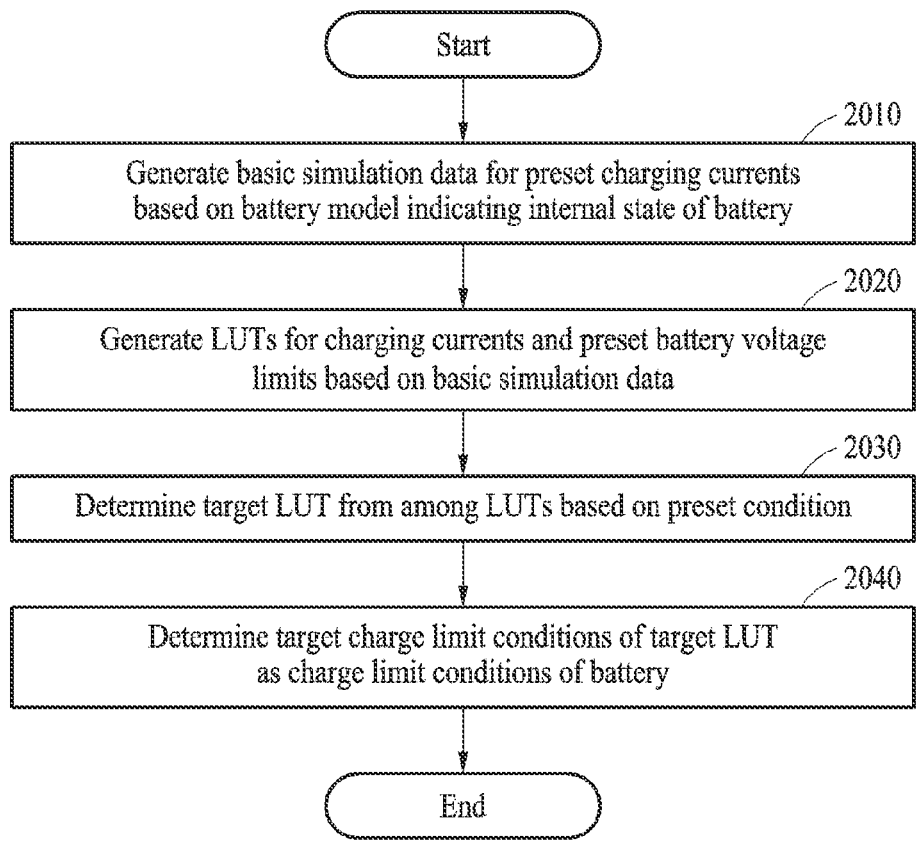
FIG. 20 illustrates an example of a method of determining charging limit condition of a battery.

FIG. 20 illustrates an example of a method of determining charging limit condition of a battery. The operations in FIG. 20 may be performed in the sequence and manner as shown, although the order of some operations may be changed or some of the operations omitted without departing from the spirit and scope of the illustrative examples described. Many of the operations shown in FIG. 20 may be performed in parallel or concurrently. One or more blocks of FIG. 20, and combinations of the blocks, can be implemented by special purpose hardware-based computer, such as a processor, that perform the specified functions, or combinations of special purpose hardware and computer instructions. In addition to the description of FIG. 20 below, the descriptions of FIGS. 1-19 are also applicable to FIG. 20, and are incorporated herein by reference. Thus, the above description may not be repeated here.

Referring to FIG. 20, operations 2010 through 2040 may be performed by the electronic device 200 described above with reference to FIGS. 3 to 14.

In operation 2010, the electronic device 200 generates basic simulation data for preset charging currents based on a battery model indicating an internal state of a battery.

The description of operation 2010 may be replaced with the description of operation 330 described above with reference to FIG. 3.

In operation 2020, the electronic device 200 generates LUTs for the preset charging currents and preset battery voltage limits based on the basic simulation data. For example, the LUTs may each represent charging limit conditions of the battery for stages corresponding to the charging currents. For example, the charging limit condition of the battery may be anode potential limits.

The description of operation 2020 may be replaced with the description of operations 340 and 350 described above with reference to FIG. 3. The LUTs may include an initial LUT and modified LUTs generated based on the initial LUT.

In operation 2030, the electronic device 200 determines a target LUT from among the LUTs based on a threshold. For example, the threshold may be whether a charging time as a charging result for each of the LUTs exceeds a preset target charging time. According to a policy preset for the electronic device 200, a LUT satisfying the threshold or a LUT previous to the LUT may be determined as the target LUT.

The description of operation 2030 may be replaced with the description of operation 360 described above with reference to FIG. 3.

In operation 2040, the electronic device 200 determines target charge limit conditions of the target LUT as the charge limit conditions of the battery.

According to examples, a battery may be charged based on a charging limit condition. For example, when a charging limit condition for a first stage of a fast charging stage is achieved while the battery is being charged with a first charging current in the first stage, the charging using the first charging current may be suspended. Then, the battery may be charged with a second charging current in a second stage of the fast charging stage.

The battery charging apparatus 120, battery charging apparatus 1912, and other apparatuses, devices, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In an example, the instructions or software includes at least one of an applet, a dynamic link library (DLL), middleware, firmware, a device driver, an application program storing the method of generating a charging path for a battery. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque(STT)-MRAM, static random-access memory (SRAM), thyristor RAM (T-RAM), zero capacitor RAM (Z-RAM), twin transistor RAM (TTRAM), conductive bridging RAM(CBRAM), ferroelectric RAM (FeRAM), phase change RAM (PRAM), resistive RAM(RRAM), nanotube RRAM, polymer RAM (PoRAM), nano floating gate Memory(NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor-implemented method, the method comprising:
generating simulation data for charging currents based on a battery model indicating an internal state of a battery;
generating an initial look-up table (LUT) for the charging currents and preset battery voltage limits based on the simulation data, the initial LUT representing initial charging limit conditions of the battery for stages corresponding to the charging currents;
generating a modified LUT by adjusting at least one of the initial charging limit conditions of the initial LUT, in response to a first operation result dependent on the initial LUT failing to satisfy a threshold;
determining a final LUT based on the modified LUT, in response to a second operation result dependent on the modified LUT satisfying the threshold;
generating a charging path for the battery based on the final LUT, and
controlling a charging of the battery based on the generated charging path,
wherein the generating of the modified LUT comprises:
generating candidate LUTs by adjusting each of the initial charging limit conditions of the initial LUT within a range;
calculating efficiencies for the candidate LUTs;
determining a target stage having a highest efficiency from among stages of the initial LUT; and
generating the modified LUT by adjusting an initial charging limit condition of the target stage.

2. The method of claim 1, wherein the charging path corresponds to a partial stage of a total charging capacity of the battery.

3. The method of claim 1, further comprising:
obtaining one or more parameters indicating a state of the battery; and
updating the battery model based on the one or more parameters,
wherein the generating of the simulation data comprises generating the simulation data for the charging currents based on the updated battery model.

4. The method of claim 1, wherein the generating of the initial LUT comprises:
determining, as a first initial charging limit condition for a first stage, an anode potential corresponding to a first time when a first charging current of the charging currents reaches a first battery voltage limit of the preset battery voltage limits;
determining, as a second initial charging limit condition for a second stage, the anode potential corresponding to a second time when a second charging current of the charging currents reaches a second battery voltage limit of the preset battery voltage limits; and
generating the initial LUT based on the first initial charging limit condition and the second initial charging limit condition.

5. The method of claim 4, further comprising:
determining whether the first operation result satisfies the threshold by:
generating a first charging result for the first stage and a second charging result for the second stage;
generating a charging result for the initial LUT based on the first charging result and the second charging result; and
determining whether the charging result satisfies the threshold.

6. The method of claim 1, wherein the calculating of the efficiencies for the candidate LUTs comprises:
calculating a first charging time and a first aging rate of a first candidate LUT; and
calculating a first efficiency for the first candidate LUT based on the first charging time and the first aging rate.

7. The method of claim 6, wherein the calculating of the first charging time and the first aging rate of the first candidate LUT comprises:
calculating a first sub-charging time and a first sub-aging rate for a first stage of the first candidate LUT;
calculating a second sub-charging time and a second sub-aging rate for a second stage of the first candidate LUT; and
calculating the first charging time based on the first sub-charging time and the second sub-charging time and calculating the first aging rate based on the first sub-aging rate and the second sub-aging rate.

8. The method of claim 1, wherein the determining of the final LUT comprises determining the modified LUT or a LUT previous to the modified LUT as the final LUT according to a preset policy.

9. The method of claim 1, wherein the determining of the final LUT comprises:
calculating a first difference between a charging time of the modified LUT and a target charging time being as the threshold;
calculating a second difference between a charging time of the LUT previous to the modified LUT and the target charging time; and
determining a LUT corresponding to a smaller one of the first difference and the second difference as the final LUT.

10. The method of claim 1, wherein the battery is included in a mobile terminal.

11. The method of claim 1, wherein the battery is included in a vehicle.

12. A non-transitory computer-readable storage medium storing instructions that, when executed by a processor, cause the processor to perform the method of claim 1.

13. An electronic device, comprising:
a processor configured to:
generate simulation data for charging currents based on a battery model indicating an internal state of a battery;
generate an initial look-up table (LUT) for the charging currents and preset battery voltage limits based on the simulation data, the initial LUT representing initial charging limit conditions of the battery for stages corresponding to the charging currents;
generate a modified LUT by adjusting at least one of the initial charging limit conditions of the initial LUT, in response to a first operation result dependent on the initial LUT failing to satisfy a threshold;
determine a final LUT based on the modified LUT when a second operation result dependent on the modified LUT satisfies the threshold;
generate a charging path for the battery based on the final LUT;
controlling a charging of the battery based on the generated charging path,
wherein the processor is configured to:

generate candidate LUTs by adjusting each of the initial charging limit conditions of the initial LUT within a range, calculate efficiencies for the candidate LUTs, determine a target stage having a highest efficiency from among stages of the initial LUT, and generate the modified LUT by adjusting an initial charging limit condition of the target stage.

14. The electronic device of claim 13, further comprising the battery, wherein the electronic device is a mobile communication terminal.

15. The electronic device of claim 13, further comprising the battery, wherein the electronic device is a vehicle.

16. A processor-implemented method, comprising:

generating simulation data for charging currents based on a battery model indicating an internal state of a battery;

generating look-up tables (LUTs) for the charging currents and preset battery voltage limits based on the simulation data, the LUTs each representing charging limit conditions of the battery for stages corresponding to the charging currents;

determining a target LUT from among the LUTs based on a threshold;

determining target charge limit conditions of the target LUT as the charge limit conditions of the battery;

controlling a charging of the battery dependent on the target charge limit conditions; and controlling a charging of the battery based on the generated charging path, wherein the generating of the LUTs comprises:

generating an initial LUT for the charging currents and the preset battery voltage limits based on the simulation data, the initial LUT representing initial charging limit conditions of the battery for the stages corresponding to the charging currents;

generating candidate LUTs by adjusting each of the initial charging limit conditions of the initial LUT within a range;

calculating efficiencies for the candidate LUTs;

determining a target stage having a highest efficiency from among stages of the initial LUT; and generating a first modified LUT by adjusting an initial charging limit condition of the target stage.

17. The method of claim 16, wherein the generating of the modified LUTs based on the initial LUT further comprises generating a second modified LUT by adjusting a value of a target initial charging limit condition of charging limit conditions included in the first modified LUT.

* * * * *